(12) United States Patent
Yen

(10) Patent No.: US 11,303,147 B2
(45) Date of Patent: Apr. 12, 2022

(54) BATTERY DEVICE AND CONTROL METHOD THEREOF

(71) Applicant: Quanta Computer Inc., Taoyuan (TW)

(72) Inventor: Wei-Ting Yen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 261 days.

(21) Appl. No.: 16/840,745

(22) Filed: Apr. 6, 2020

(65) Prior Publication Data

US 2021/0152008 A1    May 20, 2021

(30) Foreign Application Priority Data

Nov. 19, 2019  (TW) ................... 108141861

(51) Int. Cl.
*H02J 7/00* (2006.01)
*G01R 19/165* (2006.01)

(52) U.S. Cl.
CPC .. *H02J 7/007182* (2020.01); *G01R 19/16542* (2013.01); *H02J 7/0048* (2020.01); *H02J 7/00302* (2020.01); *H02J 7/00712* (2020.01); *G01R 19/16595* (2013.01); *H02J 7/00308* (2020.01)

(58) Field of Classification Search
CPC ............ H02J 7/007182; H02J 7/00302; H02J 7/00712; H02J 7/0048; G01R 19/16542
USPC ....................................................... 320/134
See application file for complete search history.

(56) References Cited

U.S. PATENT DOCUMENTS

| | | | | |
|---|---|---|---|---|
| 5,659,240 A * | 8/1997 | King | ................ | B60L 50/52 320/149 |
| 6,075,343 A * | 6/2000 | Hsu | ................ | H02J 7/0029 340/636.15 |
| 6,683,440 B2 * | 1/2004 | Kawakami | ......... | G01R 31/3648 320/133 |
| 7,628,236 B1 * | 12/2009 | Brown | ............... | B60W 20/13 180/65.21 |

(Continued)

FOREIGN PATENT DOCUMENTS

| | | | | |
|---|---|---|---|---|
| CN | 110707804 A * | 1/2020 | | |
| DE | 112014000310 B4 * | 1/2021 | ........... | G01R 31/367 |

(Continued)

*Primary Examiner* — John T Trischler
(74) *Attorney, Agent, or Firm* — McClure, Qualey & Rodack, LLP

(57) ABSTRACT

A battery device includes a storage battery unit, a current sensing unit, a temperature sensing unit, a storage unit and a processing unit. The current sensing unit detects load current. The temperature sensing unit detects the battery temperature of the storage battery unit. The storage unit stores a cycle number, multiple threshold intervals, and multiple charging voltage values. According to the load current, the battery temperature and the cycle number, the depth of discharge of the storage battery is acquired. The storage unit stores the load current, the battery temperature and the cycle number. The processing unit operates a charging procedure. The charging voltage value corresponding to the working threshold interval is selected to be the main charging voltage value, and the DC voltage that is identical to the main charging voltage value is used to perform a constant voltage charge for the battery unit.

10 Claims, 5 Drawing Sheets

(56) References Cited

U.S. PATENT DOCUMENTS

| | | | |
|---|---|---|---|
| 7,986,130 B2* | 7/2011 | Yen | H01M 10/443 320/136 |
| 8,305,040 B2* | 11/2012 | Chen | H02J 7/00309 320/132 |
| 8,384,349 B2* | 2/2013 | Suzuki | H01M 10/4207 173/214 |
| 8,453,772 B2* | 6/2013 | Brown | B60L 58/13 180/65.285 |
| 8,742,724 B2* | 6/2014 | Suzuki | H01M 10/4207 320/132 |
| 8,950,527 B2* | 2/2015 | Brown | B60W 30/18 180/65.285 |
| 8,988,046 B2* | 3/2015 | Yen | H01M 10/443 320/134 |
| 9,112,245 B2* | 8/2015 | Yen | H01M 10/486 |
| 9,146,282 B2* | 9/2015 | Wu | G01R 31/378 |
| 9,236,754 B2* | 1/2016 | Yen | H02J 7/0021 |
| 9,305,452 B2* | 4/2016 | Kung | G08B 21/185 |
| 9,463,786 B2* | 10/2016 | Brown | B60K 6/52 |
| 9,614,258 B2* | 4/2017 | Takahashi | H01M 10/48 |
| 9,684,362 B2* | 6/2017 | Yen | H02J 7/0029 |
| 9,827,972 B2* | 11/2017 | Brown | G05G 1/04 |
| 10,044,213 B2* | 8/2018 | Barsukov | H02J 7/0077 |
| 10,298,031 B2* | 5/2019 | Yen | G01R 31/389 |
| 10,386,420 B2* | 8/2019 | Yokoyama | H01M 10/4285 |
| 10,523,022 B2* | 12/2019 | Yen | H01M 10/425 |
| 10,547,185 B2* | 1/2020 | Yen | H02J 7/0029 |
| 10,566,819 B2* | 2/2020 | Barsukov | H02J 7/0077 |
| 10,649,512 B2* | 5/2020 | Ou Yang | G06F 1/266 |
| 10,725,112 B1* | 7/2020 | Jung | H02J 7/0071 |
| 10,868,342 B2* | 12/2020 | Tanaka | H02J 7/00712 |
| 10,914,789 B2* | 2/2021 | Lemkin | G01R 31/3842 |
| 11,043,821 B2* | 6/2021 | Nishikawa | H02J 7/02 |
| 11,171,500 B2* | 11/2021 | Yen | H01M 10/615 |
| 2003/0006735 A1* | 1/2003 | Kawakami | G01R 31/3648 320/133 |
| 2009/0027008 A1* | 1/2009 | Yen | H01M 10/486 320/134 |
| 2009/0027056 A1* | 1/2009 | Huang | G01R 31/392 320/132 |
| 2010/0059300 A1* | 3/2010 | Brown | B60L 50/66 74/504 |
| 2010/0085008 A1* | 4/2010 | Suzuki | B25F 5/00 324/426 |
| 2010/0085010 A1* | 4/2010 | Suzuki | H01M 10/4207 320/132 |
| 2011/0037475 A1* | 2/2011 | Ho | G01R 31/389 324/427 |
| 2011/0169459 A1* | 7/2011 | Chen | H02J 7/0069 320/160 |
| 2012/0286737 A1* | 11/2012 | Yen | H01M 10/441 320/134 |
| 2013/0002199 A1* | 1/2013 | Hu | H02J 7/007182 320/112 |
| 2013/0255434 A1* | 10/2013 | Brown | G05G 1/04 74/523 |
| 2013/0257350 A1* | 10/2013 | Yen | H02J 7/0091 320/150 |
| 2014/0184165 A1* | 7/2014 | Takahashi | H01M 10/486 429/90 |
| 2014/0195827 A1* | 7/2014 | Yen | G06F 1/263 713/300 |
| 2015/0008882 A1* | 1/2015 | Yen | H02J 7/0021 320/132 |
| 2015/0339909 A1* | 11/2015 | Kung | G06F 1/28 340/636.17 |
| 2016/0001760 A1* | 1/2016 | Brown | B60K 6/52 903/903 |
| 2016/0041230 A1* | 2/2016 | Yen | G01R 31/389 320/136 |
| 2016/0105140 A1* | 4/2016 | Taniguchi | H02J 3/32 700/287 |
| 2016/0187960 A1* | 6/2016 | Yen | H01M 10/425 713/323 |
| 2017/0070061 A1* | 3/2017 | Barsukov | H02J 7/0077 |
| 2017/0214266 A1* | 7/2017 | Takahashi | H02J 7/0019 |
| 2017/0247026 A1* | 8/2017 | Brown | B60K 26/02 |
| 2017/0328957 A1* | 11/2017 | Suzuki | H01M 10/48 |
| 2017/0371000 A1* | 12/2017 | Fukushima | H02J 7/005 |
| 2018/0069400 A1* | 3/2018 | Iwai | H02J 7/34 |
| 2018/0069410 A1* | 3/2018 | Yen | H02J 7/0047 |
| 2018/0090962 A1* | 3/2018 | Cha | B60L 53/50 |
| 2018/0316200 A1* | 11/2018 | Yen | H02J 7/0031 |
| 2018/0358663 A1* | 12/2018 | Yonemoto | B60L 50/16 |
| 2019/0006871 A1* | 1/2019 | Barsukov | H02J 7/0077 |
| 2019/0033938 A1* | 1/2019 | Ou Yang | H02J 7/04 |
| 2019/0054837 A1* | 2/2019 | Tanaka | H02J 7/02 |
| 2019/0157883 A1* | 5/2019 | Yen | H01M 10/48 |
| 2019/0178951 A1* | 6/2019 | Cha | H01M 10/44 |
| 2019/0242949 A1* | 8/2019 | Lemkin | H04Q 9/04 |
| 2019/0257890 A1* | 8/2019 | Cha | H02J 7/00 |
| 2019/0285703 A1* | 9/2019 | Juva | H02J 7/0063 |
| 2020/0130530 A1* | 4/2020 | Tsurutani | B60L 58/16 |
| 2020/0142005 A1* | 5/2020 | Yen | G01R 31/3646 |
| 2020/0161875 A1* | 5/2020 | Nishikawa | H02J 3/32 |
| 2020/0169105 A1* | 5/2020 | Watanabe | H01M 10/482 |
| 2020/0403416 A1* | 12/2020 | Yen | H01M 10/615 |
| 2020/0408846 A1* | 12/2020 | Bae | G01R 31/3842 |
| 2021/0148986 A1* | 5/2021 | Dong | G01R 31/367 |
| 2021/0305822 A1* | 9/2021 | Yu | H02J 7/0036 |
| 2021/0376638 A1* | 12/2021 | Yen | H02J 7/005 |

FOREIGN PATENT DOCUMENTS

| | | | | |
|---|---|---|---|---|
| EP | 3264560 A1 | * | 1/2018 | ......... H01M 10/425 |
| JP | H07192769 A | * | 7/1995 | |
| WO | WO-2016134658 A1 | * | 9/2016 | ......... H01M 10/425 |

* cited by examiner

BATTERY DEVICE AND CONTROL METHOD THEREOF

CROSS REFERENCE TO RELATED APPLICATIONS

This application claims priority of Taiwan Patent Application No. 108141861, filed on Nov. 19, 2019, the entirety of which is incorporated by reference herein.

BACKGROUND OF THE INVENTION

Field of the Invention

The present invention relates to a battery device and a control method thereof and, in particular, to a battery device and a control method for the storage batteries.

Description of the Related Art

With the development of electronic products and electric vehicles, the application of storage batteries (also called secondary batteries) becomes more popular. Thus, it has become important for the present technology to extend the cycle life of storage batteries effectively. Because current market demand keeps changing, most consumers prefer electronic products with a fast charging function. However, fast charging can easily over charge storage batteries, which may decrease the cycle life of the storage batteries. In addition, when the storage batteries provide power to a heavy load, because the heavy load requires a large current, the storage batteries may easily be over-discharged, causing the capacity of the storage batteries to become too low. Low battery capacity is also an important factor in reducing the storage battery's cycle life.

During the discharging procedure of a storage battery, if the load is changed from a heavy load to a light load, the storage battery would produce a phenomenon of voltage rise. Because traditional techniques do not take the phenomenon of voltage rise into consideration, the storage battery is usually charged at a fixed rate of voltage after the discharging procedure of a storage battery is finished. Therefore, when the storage battery is charged to reach the target voltage, the phenomenon of voltage rise further increases the battery voltage of the storage battery. Consequently, the battery voltage of the storage battery is increased to exceed the rated saturation voltage (also called nominal capacity). As a result, the traditional techniques often cause the storage battery to be overcharged.

In view of this, the present invention proposes a battery device and a control method thereof in order to solve the problems mentioned above. According to the practical application of the storage battery, the present invention can automatically regulate the charging voltage to avoid overcharging. In addition, the present invention can also effectively prevent the storage battery from being over-discharged.

BRIEF SUMMARY OF THE INVENTION

A battery device includes a storage battery unit, a current sensing unit, a temperature sensing unit, a storage unit and a processing unit. The current sensing unit is coupled to the storage battery unit and a load for detecting a load current. The temperature sensing unit is configured to measure the battery temperature of the storage battery unit. The storage unit is configured to store the cycle number of the storage battery unit, a plurality of threshold intervals, and a plurality of charging voltage values, wherein each of the plurality of threshold intervals respectively corresponds to each of the plurality of charging voltage values. The processing unit is coupled to the storage battery unit and the storage unit, and configured to receive the load current and the battery temperature. The processor is configured to perform a discharging record procedure, including the following steps: obtaining a depth of discharge (DOD) for the storage battery unit based on the load current, the battery temperature and the cycle number, and whenever the processing unit obtains the load current, the battery temperature, and the DOD, the processing unit stores the load current, the battery temperature, and the DOD in the storage unit. The processing unit is also configured to perform a charging procedure, including the following steps: retrieving the maximum value of the plurality of DOD from the storage unit; identifying one of the plurality of the threshold intervals that the maximum value falls within to be a working threshold interval; selecting the charging voltage value corresponding to the working threshold interval to be the main charging value; and using a DC voltage with the main charging value to perform a constant voltage charging of the storage battery unit.

A control method for a storage battery unit, including the following steps: detecting a load current; detecting the battery temperature of the storage battery unit; storing a cycle number of the storage battery unit, a plurality of threshold intervals, and a plurality of charging voltage values, wherein each of the plurality of threshold intervals respectively corresponds to each of the plurality of charging voltage values. Perform a discharging record procedure, comprising the following steps: receiving the load current to store it in a storage unit; receiving the battery temperature to store it in a storage unit and whenever the load current and the battery temperature are obtained, the load current and the battery temperature are stored in the storage unit to generate a plurality of load current and a plurality of battery temperatures. Perform a charging procedure, comprising the following steps: retrieving the maximum value of the plurality of load current from the storage unit; retrieving the maximum value of the plurality of battery temperature from the storage unit; computing a depth of discharge (DOD) for the storage battery unit based on the maximum value of the plurality of load current, the maximum value of the plurality of battery temperature and the cycle number; identifying one of the plurality of the threshold intervals that the DOD falls within to be a working threshold interval; selecting the charging voltage value corresponding to the working threshold interval to be the main charging value; and using a DC voltage with the main charging value to perform a constant voltage charging of the storage battery unit.

DETAILED DESCRIPTION OF THE INVENTION

Figure 1:
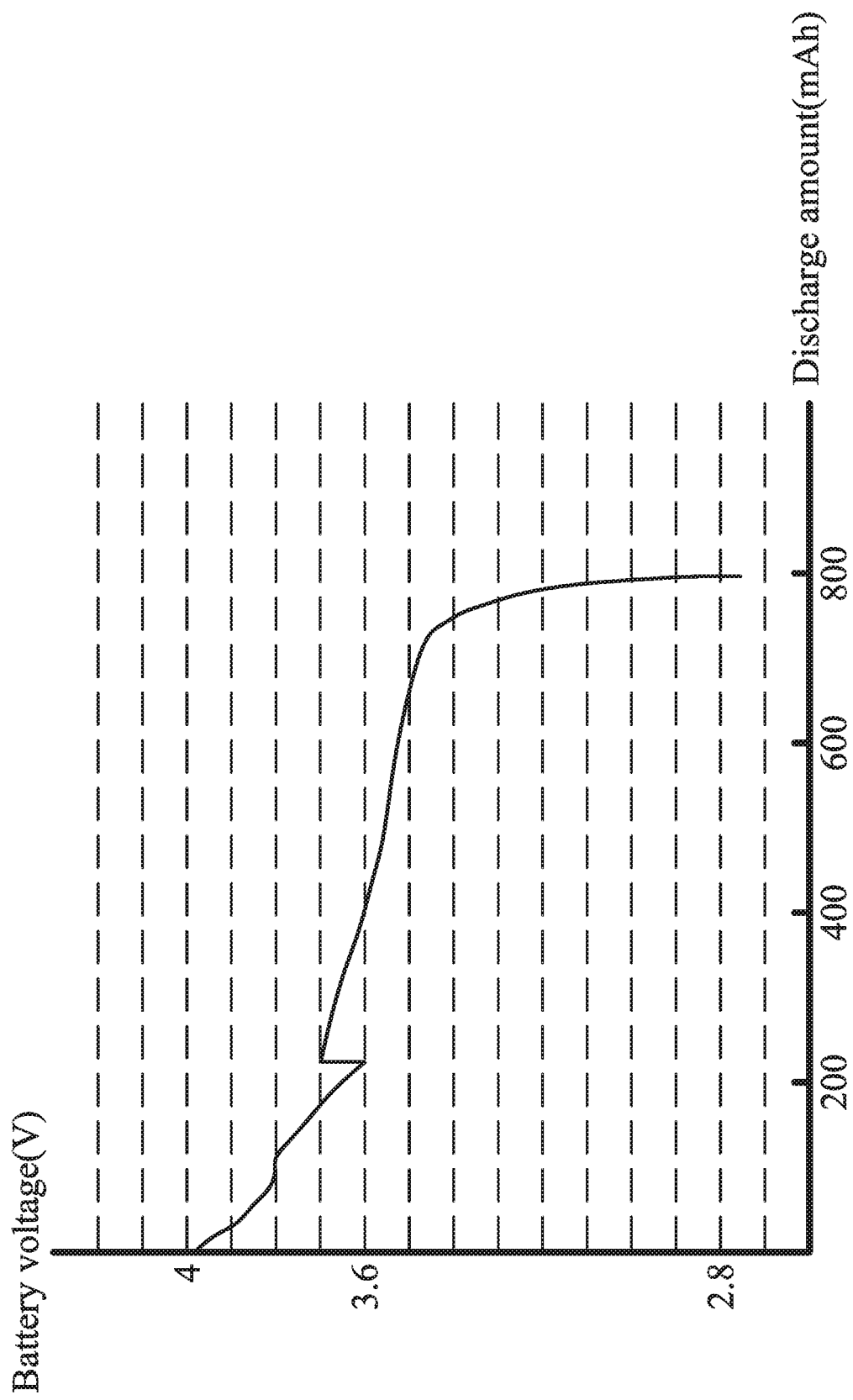
FIG. 1 is a waveform for a traditional storage battery's discharging in accordance with one embodiment of the present invention.

The present invention is described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The following description is an embodiment of the present invention. The purpose of the present invention is to exemplify the general principles of the invention and should not be construed as limiting the scope of the invention, which is defined by the scope of the claims.

FIG. 1 is a waveform for a traditional storage battery's discharging in accordance with one embodiment of the present invention. During the discharge of the storage battery, the variation of the load may cause a phenomenon of voltage rise occurred in the storage battery. When the storage battery is discharged, the discharging amount of the battery is increased, and the voltage of the storage battery is reduced. When the voltage of the storage battery is lowered to a cut-off discharge voltage, the storage battery stops discharging and the discharging amount is stopped increasing.

As shown in FIG. 1, the initial value of the battery voltage of the storage battery is 4 volts. When the storage battery begins to discharge, providing power to the load, the battery voltage of the storage battery is reduced from 4 volts, and the discharging amount of the storage battery is increased gradually. When the battery voltage of the storage battery is lowered to reach 3. 6 volts, the load is changed to be a light load so that the battery voltage of the storage battery is increased, and the phenomenon is known as a phenomenon of voltage rise.

If the storage battery provides power to a heavy load, the phenomenon of voltage rise becomes greater (the increment of the voltage becomes greater). If the storage battery provides power to a light load, the phenomenon of voltage rise becomes smaller (the increment of the voltage becomes smaller). More specifically, the amount of the change of the load is larger, so the phenomenon of voltage rise becomes greater. Conversely, the amount of the change of the load is smaller, so the phenomenon of voltage rise becomes smaller. For example, when the load is changed from a full load to no load, the phenomenon of voltage rise is the greatest. when the load is changed from a light load to no load, the phenomenon of voltage rise is much smaller.

Therefore, the conventional techniques charge the storage battery with a fixed constant voltage. In some embodiments, after the storage battery provides power to a heavy load, the storage battery needs to be charged for the next discharge. At this time, during the process of the battery being charged, the conventional charging technology does not take the phenomenon of voltage rise into consideration so that the voltage of the storage battery exceeds the initial set value (rated saturation voltage). If the voltage of the storage battery exceeds the initial set value, the storage battery is overcharged. The present invention mainly proposes a control method of a battery device by utilizing the phenomenon of voltage rise, so as to prevent the battery from being overcharged.

Figure 2:
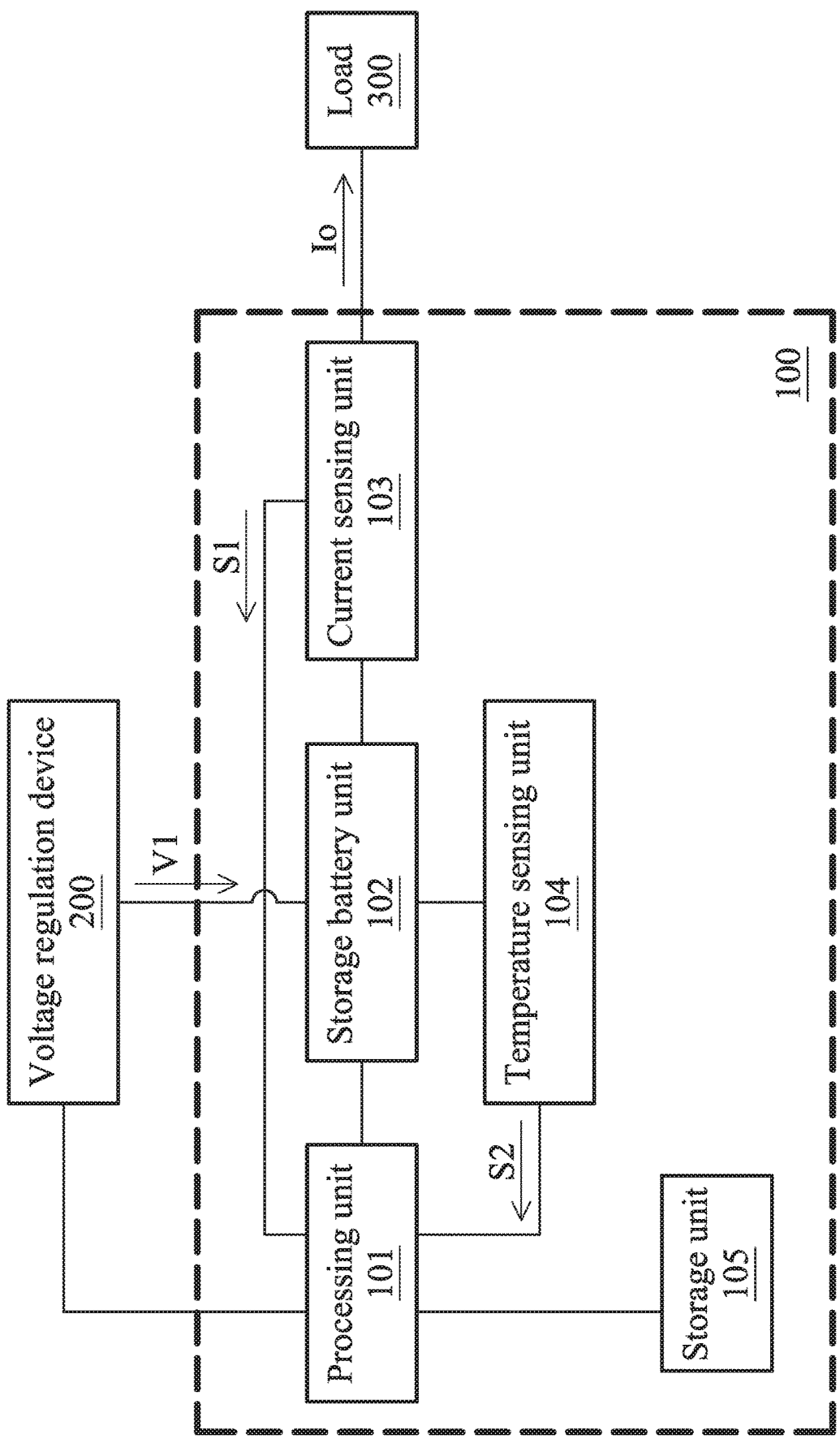
FIG. 2 is a block diagram for a battery device in accordance with one embodiment of the present invention.

FIG. 2 is a block diagram for a battery device 100 in accordance with one embodiment of the present invention. As shown in FIG. 2, the battery device includes a storage battery unit 102, a current sensing unit 103, a temperature sensing unit 104, a storage unit 105 and a processing unit 101. The processing unit 101 is respectively coupled to the storage battery unit 102, the current sensing unit 103, the temperature sensing unit 104 and the storage unit 105. In addition, the processing unit 101 is also coupled to a voltage regulation device 200. The processing unit 101 controls the voltage regulation device 200 to output a direct current voltage V1 (also called DC voltage V1) for performing a constant voltage charge to the storage battery 102. In some embodiments, when the storage battery unit 102 is discharged, the processing unit 101 stops the voltage regulation device 200 outputting the DC voltage V1. Therefore, it can avoid the storage battery unit 102 from being damaged by the voltage regulation device 200 charging the storage battery unit 102 when the storage battery unit 102 is discharging.

The current sensing unit 103 in the battery device 100 is coupled between the storage battery unit 102 and the load 300 for detecting the load current Io. The load current Io is generated by the storage battery unit 102, and the load current Io passes through the current sensing unit 103 and the load 300. In some embodiments, the current sensing unit 103 can be a hall sensor or current sense resistor etc., but the present invention is not limited thereto. According to the load current Io, the current sensing unit 103 outputs the first sense signal S1 to the processing unit 101. The processing unit 101 acquires the value of the load current Io based on the first sense signal S1.

The temperature sensing unit 104 in the battery device 100 is configured to detect the battery temperature of the storage battery unit 102. When the storage battery unit 102 is being charged or discharging, the battery temperature of the storage battery unit 102 keeps increasing as well. The temperature sensing unit 104 detects the battery temperature of the storage battery unit 102 and outputs the second sense signal S2 to the processing unit 101. The processing unit 101 acquires the value of the battery temperature based on the second sense signal S2.

The storage unit 105 in the battery device 100 is configured to store a cycle number of the storage battery unit 102, a plurality of threshold intervals, and a plurality of charging voltage values, wherein each of the plurality of threshold intervals respectively corresponds to each of the plurality of charging voltage values. The cycle number of the storage battery unit 102 represents that the number of times for completing charging and discharging of the storage battery unit 102. In some embodiments, when the cycle number is "1", it represents that the storage battery unit 102 completes a discharging procedure and completes a charging procedure for fully charge the storage battery unit 102. The cycle number of the storage battery unit 102 represents the cycle life of the storage battery unit 102. For the general storage batteries, the cycle number of the storage batteries continues to increase until the rated cycle number of the storage batteries is reached. When the cycle number reaches the rated cycle number, the cycle life of the storage batteries is over, and the storage batteries can no longer be used.

In some embodiments, the plurality of threshold intervals and the plurality of charging voltage values stored in the storage unit 105 are shown as table 1, but the present invention is not limited thereto.

TABLE 1

| Threshold interval | Charging voltage value (volts) |
|---|---|
| 0~50000 | 4.4 |
| 50000~100000 | 4.375 |
| 100000~200000 | 4.35 |
| 200000~250000 | 4.325 |
| 250000~300000 | 4.3 |
| 300000 | 4.275 |

The processing unit 101 can compute the depth of discharge (DOD) for the storage battery unit 102 and identify which one of threshold intervals, shown as Table 1, that the DOD falls within. Then, the processing unit 101 retrieves the charging voltage value corresponding to the identified threshold interval. For example, if the processing unit 101 computes that the DOD falls within the threshold interval, which is 0~50000, the processing unit 101 retrieves the charging voltage value from the storage unit 105, which is 4.4 volts. Then, the processing unit 101 controls the voltage regulation unit 200 to perform a constant voltage charge to the storage battery unit 102 with 4.4 volts of DC voltage. The plurality of threshold intervals stored in the storage unit 105 can be flexibly preset in accordance with the actual conditions.

Therefore, the DOD of the storage battery unit 102 plays an important role in the present invention, so the present invention will illustrate how to acquire the DOD below in detail.

As shown in FIG. 2, the processing unit 101 can be used to control the storage battery unit 102 to discharge and control the voltage regulation device 200 to perform a constant voltage charge to charge the storage battery unit 102.

At first, when the processing unit 101 controls the storage battery unit 102 to discharge, the processing unit 101 performs a discharging record procedure simultaneously.

During the discharging record procedure, the processing unit 101 can receive the first sense signal S1 from the current sensing unit 103 to identify the value of the load current Io which is output by the storage battery unit 102. The processing unit 101 also receives the second sense signal S2 from the temperature sensing unit 104 to identify the value of the battery temperature of the storage battery unit 102.

In some embodiments, the processing unit 101 reads the first sensing signal S1 of the current sensing unit 103 at every preset time for determining the value of the load current Io. The unit of the preset time can be second(s), minute(s), hour(s), day(s) or week(s) etc., but the present invention is not limited to this. The users can set an appropriate preset time according to the actual demands. As shown in Table 2 below, whenever the processing unit 101 identifies the value of the load current Io, the processing unit 101 stores the value of the load current Io in the storage unit 105 and set a current factor for representing the value of the load current Io, but the present invention is not limited thereto.

TABLE 2

|  | Load current Io | Current factor |
|---|---|---|
| $1^{st}$ | 0.2 C | 1 |
| $2^{nd}$ | 0.4 C | 2 |
| $3^{rd}$ | 0.6 C | 4 |
| $4^{th}$ | 0.8 C | 16 |
| $5^{th}$ | 1.0 C | 256 |

In table 2, the current factor set by the processing unit 101 is proportional to the load current Io. In general, the larger the load current Io, the larger the working current required by the load 300. For example, when the electric vehicle runs at high speed, the storage battery would supply a higher load current Io. Conversely, when the electric vehicle runs at slow speed, the storage battery would supply a lower load current Io. Furthermore, generally, when most storage batteries output a load current which is more than 1C, the storage batteries will perform a protection mode to avoid the storage batteries from being damaged. As a result, when the processing unit 101 creates Table 2 in the storage unit 105, the processing unit 101 usually cannot read the load current Io which is more than 1C. Therefore, the current factor corresponding to load current Io which is 1C is a maximum value, but the present invention is not limited thereto.

C(C-rate) recited in the present invention represents the unit of the capacity of the storage battery. Except for ampere (or milliampere) representing the unit of the charging current (or discharging current) of batteries, a person having ordinary skill in the art can comprehend that C(C-rate) can be taken as the current portion of the rated capacity (Current multiplied by Time), so C(C-rate) can be used as unit for the value of current. C(C-rate) is inversely proportional to Time; therefore, when the value of C(C-rate) becomes larger, it means that the charging/discharging current of the battery becomes larger, and the charge/discharge time of the battery becomes shorter. On the contrary, when the value of C (C-rate) becomes smaller, it means that the charging/discharging current of the battery becomes smaller, and the charge/discharge time of the battery becomes longer. For example, 1C represents that the all of the electric capacity in a battery is fully charged or discharged in one hour. 2C represents that the all of the electric capacity in the battery is fully charged or discharged in half an hour (30 minutes). 10C represents that the all of the electric capacity in the battery is fully charged or discharged in 0.1 hour(s) (6 minutes). 0.5C represents that the all of the electric capacity in the battery is fully charged or discharged in two hours (120 minutes). For example, if the capacity of the storage battery is 10000 mAh, 1C represents the value of current is 10000 mA, and 2C represents the value of current is 20000 mA. As a result, C(C-rate) represents the value of load current Io in the present invention for facilitating to illustrate the operations and principles of the present invention, but the present invention is not limited thereto.

In some embodiments, the processing unit 101 reads the second sensing signal S2 of the temperature sensing unit 104 at every preset time for determining the value of the battery temperature. The unit of the preset time can be second(s), minute(s), hour(s), day(s) or week(s) etc., but the present invention is not limited to this. The users can set an appropriate preset time according to the actual demands. As shown in Table 3 below, whenever the processing unit 101 identifies the value of the battery temperature, the processing unit 101 stores the value of the battery temperature in the storage unit 105 and set a temperature factor for representing the value of the battery temperature, but the present invention is not limited thereto.

TABLE 3

| | Battery temperature (° C.) | temperature factor |
|---|---|---|
| $1^{st}$ | 0 | 1 |
| $2^{nd}$ | 20 | 2 |
| $3^{rd}$ | 30 | 4 |
| $4^{th}$ | 40 | 8 |
| $5^{th}$ | 50 | 16 |
| $6^{th}$ | 60 | 32 |

For most storage batteries, when the battery temperature exceeds the 60° C., the storage batteries will perform a protection mode to avoid the storage batteries from being damaged. As a result, when the processing unit 101 creates Table 3 in the storage unit 105, the processing unit 101 usually cannot read the battery temperature which is more than 60° C. Therefore, the temperature factor corresponding to the battery temperature which is 60° C. is a maximum value, but the present invention is not limited thereto.

In other embodiments, the processing unit 101 may also set a temperature factor to represent the range of battery temperature change, as shown in Table 4:

TABLE 4

| Battery temperature (° C.) | temperature factor |
|---|---|
| 0~20 | 1 |
| 21~30 | 2 |
| 31~40 | 4 |
| 41~50 | 8 |
| 51~60 | 16 |
| ≥60 | 32 |

The same as Table 3, the processing unit 101 usually cannot read the battery temperature which is more than 60° C. Therefore, the temperature factor corresponding to the battery temperature which is 60° C. is a maximum value, but the present invention is not limited thereto.

In Table 3 or Table 4, the higher battery temperature usually means that the storage battery is used for the longer time or means that the load current Io output by the storage battery is higher. Specifically, in some embodiments, the battery temperature in Table 3 or Table 4 may correspond to the load current Io in Table 2. According to actual needs, the processing unit 101 may be adjusted to create any one of Table 3 or Table 4 in the storage unit 105.

In some embodiments, whenever the processing unit 101 acquires the battery temperature and the load current Io each time, the processing unit 101 computes the DOD of the storage battery unit 102 based on the load current Io, the battery temperature and the cycle number. At first, the processing unit 101 converts the load current Io into a corresponding current factor and converts the battery temperature into a corresponding temperature factor. Then, the processing unit 101 computes the DOD by using Equation (1) shown as below:

$$\text{current factor} * \text{temperature factor} * \text{cycle number} = \text{depth of discharge(DOD)} \quad (1)$$

The processing unit 101 computes the DOD of the storage battery unit 102 and stores the DOD in the storage unit 105. When the processing unit 101 completes the computation of the DOD, the discharging record procedure is completed. If the storage battery unit 102 still continues to provide load current Io to the load 300, the processing unit 101 repeatedly perform the discharging record procedure for generating a plurality of DOD in the storage unit 105. When the processing unit 101 detects that the relative state of charge (RSOC) for the storage battery unit 102 is smaller than (or equal to) 3%, the processing unit 101 stops the storage battery unit 102 from providing the load current Io, and the processing unit 101 stops performing the discharging record procedure repeatedly.

For a person skilled in the art, RSOC can define the remaining electric capacity of the storage battery. RSOC is usually expressed in percentage. The remaining electric capacity of the storage battery is influenced by the charge current, discharge current, battery temperature and cycle number. In general, the range of RSOC is 0%~100%. When the storage battery is fully charged, RSOC is 100%. When the storage battery is fully discharged, RSOC is 0%. Generally, when RSOC of the storage battery unit 102 is smaller than (or equal to) 3%, the voltage of storage battery unit 102 reaches minimal discharge voltage. At this time, if the storage battery unit 102 is not charged, the storage battery unit 102 is possibly damaged.

When the storage battery unit 102 stops providing the load current Io, the processing unit 101 stops performing the discharging record procedure. Simultaneously, the processing unit 101 completes to create Table 2 and Table 3 (or Table 4) and compute the plurality of the DOD.

When the processing unit 101 controls the voltage regulation device 200 to charge the storage battery unit 102, the processing unit 101 performs a charge procedure. During the charging procedure, the processing unit 101 selects the maximum value of the DOD from the storage unit 102. According to Table 1, the processing unit 101 identifies one of the plurality of the threshold intervals that the maximum value falls within to be a working threshold interval. For example, in Table 1, if the processing unit 101 identifies the maximum value falls within the threshold interval being range of 50000~100000, the processing unit 101 takes the threshold interval: 50000~100000 as a working threshold interval.

Then, from Table 1, the processing unit 101 selects the charging voltage value corresponding to the working threshold interval to be the main charging value. For example, after selecting the threshold interval: 50000~100000 to be the working threshold interval, the processing unit 101 selects 4.375 volts to be the main charging value.

Eventually, the processing unit 101 controls the voltage regulation device 200 to provide DC voltage V1 for performing the constant voltage charge to the storage battery unit 102, and the value of the DC voltage V1 is equal to the main charging value (ex. 4.375 volts).

In some other embodiments, during the discharging record procedure, the processing unit 101 simply completes to store Table 2 and Table 3 (or Table 4) in the storage unit 105. When the processing unit 101 performs the charging procedure, the processing unit 101 selects the maximum value of the current factors (ex. 256), and selects the maximum value of the temperature factors (ex. 32). Next, the processing unit 101 substitutes the maximum current factor (ex. 256) and the maximum temperature factor (ex. 32) into Equation (1) to calculate the DOD.

Then, according to Table 1, the processing unit 101 identifies the DOD falls within which one of the threshold intervals for selecting the corresponding charging voltage value to be the main charging value. Eventually, the processing unit 101 controls the voltage regulation device 200 to provide DC voltage V1 for performing the constant voltage charge to the storage battery unit 102, and the value of the DC voltage V1 is equal to the main charging value.

During the process of charging the battery unit 102 by the voltage adjustment device 200, the processing unit 101 detects the battery voltage of the storage battery unit 102. When the battery voltage of the storage battery unit 102 approaches the main charging value within an error range, the processing unit 101 stops the charging procedure and stops the storage battery unit 102 from being charged by the voltage adjustment device 200. Simultaneously, the processing unit 101 increases the cycle number in the storage unit 105.

When the storage battery unit 102 is going to process the next discharge, the processing unit 101 re-executes the discharging record procedure mentioned above, and recreates Table 2 and Table 3 (or Table 4). According to the completed Tables 2 and 3 (or Table 4), the processing unit 101 performs the next charging procedure.

In some embodiments, the storage battery unit 102 can be a Lead-acid Battery, a Nickel-cadmium Battery, a NiMH Battery, a Nickel-zinc Battery, a Lithium Battery, a Carbon-zinc Battery, an Aluminum battery etc., but the present invention is not limited thereto.

In some embodiments, the processing unit 101 can be a controller, a central processing unit (CPU), a graphic processing unit (GPU), a field programmable gate array (FPGA), a micro control unit (MCU), a micro processing unit (MPU) etc., but the present invention is not limited thereto.

In some embodiments, the storage unit 105 can be a dynamic random access memory (DRAM), a static random access memory (SRAM), a flash memory, an electrically erasable programmable read only memory (EEPROM), a non-volatile memory, a hard disk drive (HDD) or solid-state disk (SSD) etc., but the present invention is not limited thereto.

Figure 3:
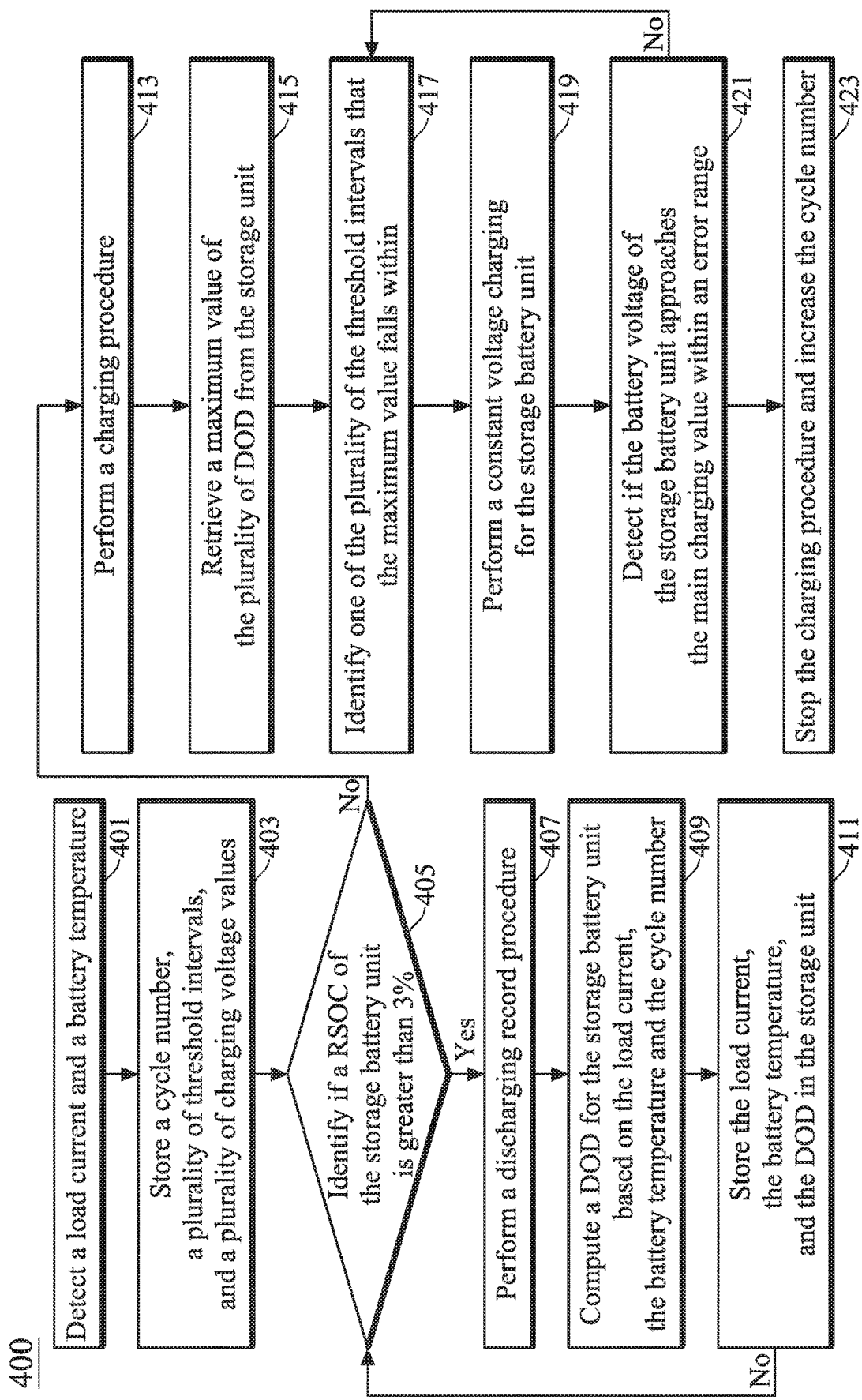
FIG. 3 is a flow chart for a control method of the battery device in accordance with one embodiment of the present invention.

FIG. 3 is a flow chart for a control method 400 of the battery device 100 in accordance with one embodiment of the present invention. Please refer to FIG. 2 and FIG. 3 for illustrating each of the following embodiments. The control method 400 is mainly performed by the battery device 100, and the battery device 100 begins at step 401.

At step 401, the current sensing unit 103 in the battery device detects the load current Io, wherein the storage battery unit 102 outputs the load current Io to the load 300. In addition, the temperature sensing unit 104 in the battery device 100 detects the battery temperature of the storage battery unit 102. The current sensing unit 103 outputs the first sense signal S1 to the processing unit 101, and the temperature sensing unit 104 outputs the second sense signal S2 to the processing unit 101. According to the first sense signal S1 and the second sense signal S2, the processing unit can identify the value of the load current Io output by the storage battery unit 102 and the value of the battery temperature of the storage battery unit 102. At this time, the processing unit 101 sets the current factor corresponding to the load current Io and sets the temperature factor corresponding to the battery temperature. Then, the battery device 100 continues to perform step 403.

At step 403, the storage unit 105 is configured to store the a cycle number of the storage battery unit 102, a plurality of threshold intervals, and a plurality of charging voltage values, wherein each of the plurality of threshold intervals respectively corresponds to each of the plurality of charging voltage values, as shown in Table 1. Then, the battery device 100 continues to perform step 405.

At step 405, the processing unit 101 identifies if the RSOC of the storage battery unit 102 is greater than 3%. If the processing unit 101 identifies the RSOC of the storage battery unit 102 is greater than 3%, the processing unit enters step 407 for performing the discharging record procedure. If the processing unit 101 identifies the RSOC of the storage battery unit 102 is smaller than (or equal to) 3%, the processing unit enters step 413 for performing the charging procedure.

When the processing unit 101 enters step 407, the processing unit 101 continues to perform step 409. At step 409, according to the load current Io, the battery temperature and the cycle number, the processing unit 101 computes the DOD of the storage battery unit 102. The processing unit 101 converts the load current Io into current factor and converts the battery temperature into temperature factor. The processing unit 101 substitutes the maximum current factor and the maximum temperature factor into Equation (1) to calculate the DOD. Then, the processing unit 101 continues to perform step 411.

At step 411, the processing unit 101 stores the load current Io, the current factor, the battery temperature, the temperature factor and the DOD in the storage unit 105. After completing step 411, the processing unit 101 returns to step 405. If the RSOC is still greater than 3%, the processing unit 101 continues to perform steps 407~411 for acquiring the new values of the load current Io and the battery temperature. The processing unit 101 also computes the DOD. As a result, after performing steps 405~411 repeatedly, the storage unit 105 stores a plurality of the DOD. Simultaneously, after performing steps 405~411 repeatedly, the processing unit 101 creates Table 2 and Table 3 (or Table 4) in the storage unit 105. When the RSOC is smaller than (or equal to) 3%, the processing unit 101 enters step 413 for performing the charging procedure. The charging procedure begins at step 415.

At step 415, the processing unit 101 retrieves the maximum value of the DOD from the storage unit 105. Then, the processing unit 101 continues to perform step 417.

At step 417, according to Table 1 stored in the storage unit 105, the processing unit 101 identifies one of the plurality threshold intervals that the maximum value of the DOD falls within to be a working threshold interval. For example, if the processing unit 101 identifies the maximum value falls within the threshold interval being the range of 0~50000, the processing unit 101 takes the threshold interval: 0~50000 as a working threshold interval. Then, the processing unit 101 enters step 419.

At step 419, the processing unit 101 selects the charging voltage value which corresponds to the working threshold interval to be the main charging value, and the processing unit 101 controls the voltage regulation device 200 to provide DC voltage V1 for performing a constant voltage charge to the storage battery unit 102. The value of the DC voltage V1 is identical with the main charging value. For example, as shown in FIG. 1, if the working threshold interval is 0~50000, the charging voltage value corresponding to the working threshold interval is 4.4 volts. Thus, the processing unit 101 controls the voltage regulation device 200 to provide DC voltage V1 with 4.4 volts for performing a constant voltage charge to the storage battery unit 102. Then, the processing unit enters step 421.

At step 421, the processing unit 101 identifies if the battery voltage of the storage battery unit 102 approaches the main charging value within an error range. When the battery voltage of the storage battery unit 102 approaches the main charging value in an error range, the processing unit 101 performs step 423. At step 423, the processing unit stops performing the charging procedure and increases the cycle number in the storage unit 105. In some embodiments, the error range is about ±5%, but the present invention is not limited thereto.

At step 421, when the battery voltage of the storage battery unit 102 does not approach the main charging value in the error range, the processing unit 101 repeats to perform steps 419 and 421. When the battery device 100 stops the charging procedure, it represents that the RSOC of the storage battery unit 102 is 100% (means: the storage battery unit 102 is fully charged).

Figure 4:
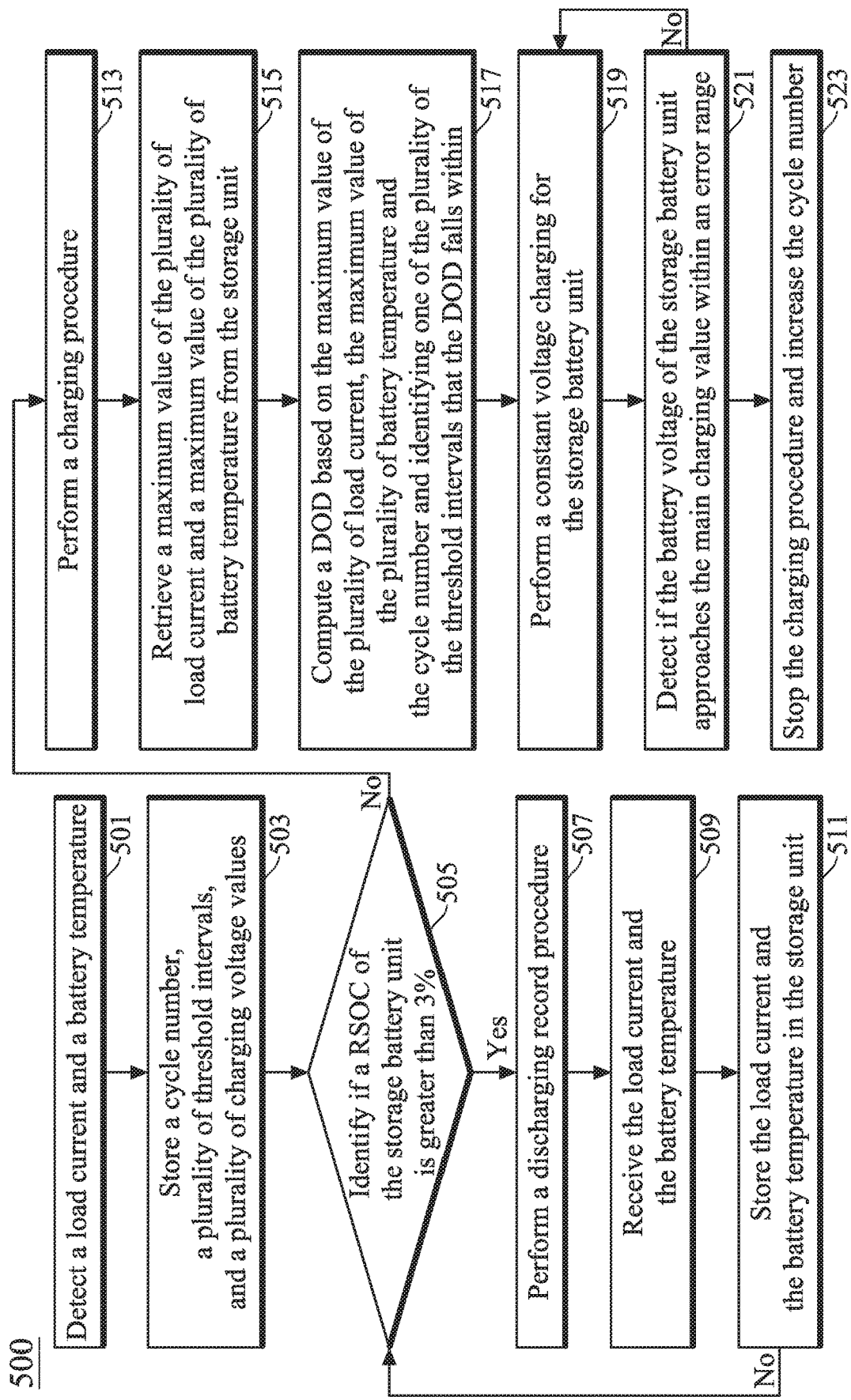
FIG. 4 is a flow chart for a control method of the battery device in accordance with another one embodiment of the present invention.

FIG. 4 is a flow chart for a control method 500 of the battery device 100 in accordance with another one embodiment of the present invention. Please refer to FIG. 2 and FIG. 4 for illustrating each of the following embodiments. The control method 500 is mainly performed by the battery device 100, and the battery device 100 begins at step 501. Comparing to the control method 400 (as shown in FIG. 3), steps 501 to 507 of the control method 500 is identical to steps 401 to 407 of the control method 400. Therefore, in this embodiment, the present invention is only illustrated from step 509.

At step 509, the processing unit 101 receives the first sense signal S1 of the current sensing unit 103 for acquiring the value of the load current Io. The processing unit 101 also receives the second sense signal S2 of the temperature sensing unit 104 for acquiring the value of battery temperature. Then, the processing unit 101 continues to perform step 511.

At step 511, the processing unit stores the value of the load current Io and the value of battery temperature in the storage unit 105. Then, the processing unit 101 returns to step 505 and identifies if the RSOC is greater than 3%. If the RSOC is greater than 3%, the processing unit 101 continues to perform steps 507 to 511. By repeating steps 505 to 511, the storage unit 105 stores the plurality of load currents Io, the plurality of battery temperatures, the plurality of current factors and the plurality of temperature factors. According to this, the processing unit 101 creates and stores Table 2 and Table 3 (or Table 4) in the storage unit 105.

At step 505, when the processing unit 101 identifies that the RSOC of the storage battery unit 102 is smaller than (or equal to) 3%, the processing unit 101 stops the discharging record procedure and performs the charging procedure in step 513.

At step 515, the processing unit 101 retrieves the maximum value of the load currents Io and the maximum value of battery temperatures. According to Table 2, the processing unit 101 retrieves the current factor corresponding to the maximum value of the load currents. According to Table 3, the processing unit 101 retrieves the temperature factor corresponding to the maximum value of battery temperatures. Then, the processing unit 101 performs 517.

At step 517, according to the maximum value of the load currents Io, the maximum value of battery temperatures and cycle number, the processing unit 101 computes the DOD of the storage battery unit 102. The processing unit 101 substitutes the current factor and the temperature factor acquired at step 515 into Equation (1) to calculate the DOD. According to Table 1, the processing unit identifies that the DOD falls within which one of the threshold intervals. For example, according to Table 1, if the processing unit 101 identifies that the DOD falls within the threshold interval which is 50000~100000, the processing unit takes this threshold interval as a working threshold interval. Then, the processing unit 101 performs steps 519 to 523. Steps 519 to 523 of the control method 500 are the same as steps 419 to 423 of the control method 500, so the present invention does not repeat the illustration.

Figure 5:
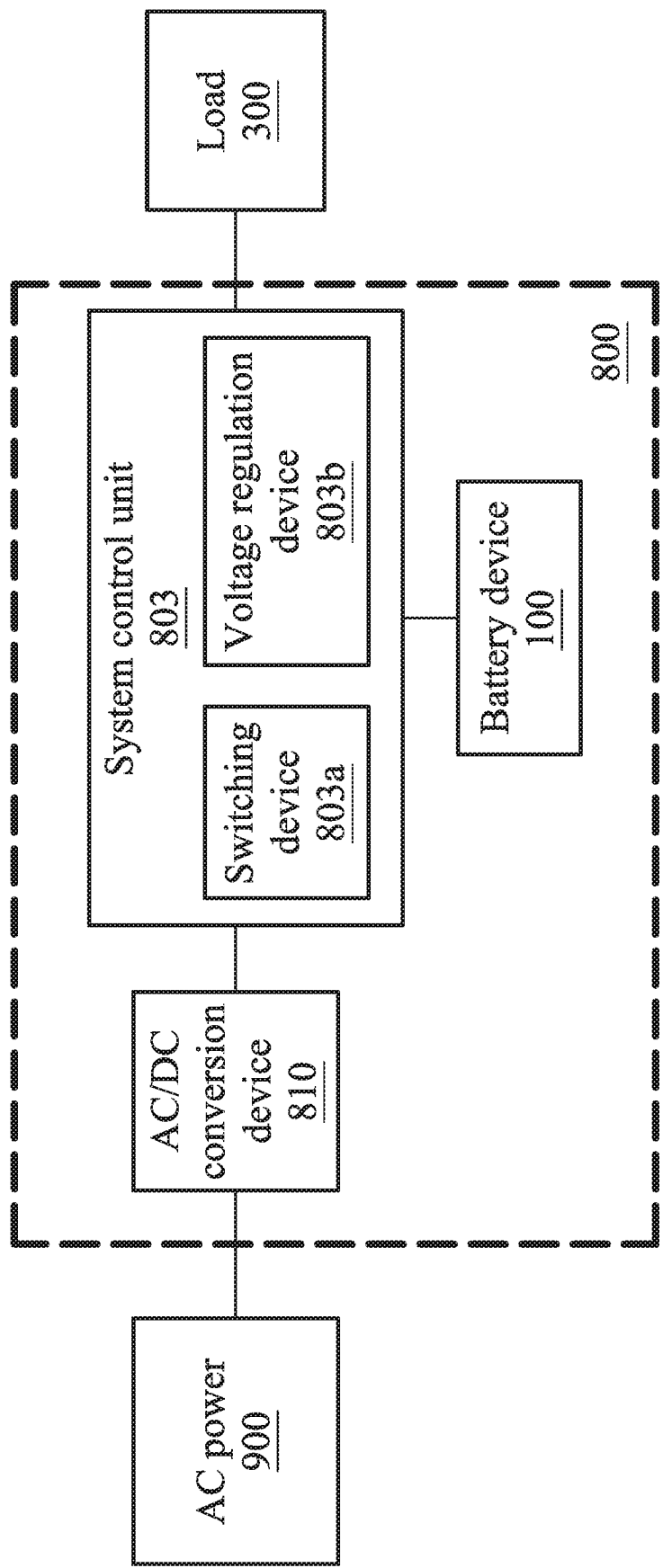
FIG. 5 is a block diagram for a power system in accordance with another one embodiment of the present invention.

The control methods 400 and 500 proposed by the present invention, shown as FIG. 4 and FIG. 5, can effectively avoid the storage battery unit form being overcharged. Please refer to Table 5. Table 5 shows the results of experiments performed on the storage battery by using the control method 400 of the present invention. The maximum charging voltage of the storage battery for the experiment is 4.4 volts.

TABLE 5

| Load current Io | Charging voltage(volts) | RSOC of battery |
|---|---|---|
| <0.2 C | 4.4 | 100% |
| 0.4 C | 4.375 | 99% |
| 0.6 C | 4.35 | 97.5% |
| 0.8 C | 4.325 | 95% |
| 1.0 C | 4.3 | 92.5% |

Please refer to FIG. 2, FIG. 3 and Table 5. In Table 5, the smaller the load current Io, the smaller the power required by the load 300 (means: light load). Conversely, the larger the load current Io, the larger the power required by the load 300 (means: heavy load). When the load current Io is smaller than 0.2C, the processing unit 101 controls the voltage regulation device 200 to charge the storage battery unit 102 with the charging voltage being 4.4 volts. At this time, after completing the charging procedure, the RSOC of the storage battery is 100%, and the storage battery unit is fully charged. When the load current Io is smaller than 0.2C, the storage battery is not prone to the phenomenon of voltage rise. Therefore, the storage battery can be charged by using the maximum charging voltage 4.4 volts.

As shown in Table 5, if the load current Io is increased, the charging voltage of for the storage battery is decreased. Because the load current Io is increased, the battery temperature of the storage battery is increased as well. According to Table 2 and Table 3, the higher the load current Io, the higher the current factor. The higher the battery temperature, the higher the temperature factor. According to Equation (1), the DOD computed by the processing unit 101 becomes higher. According to Table 1, if the DOD is becomes higher, the threshold interval that the DOD falls within also becomes higher. According to Table 1, when the DOD falls within a higher threshold interval, the corresponding charging voltage becomes lower.

When the load current Io becomes higher, the load 300 is closed to a heavy load so that the phenomenon of voltage rise of the storage battery is more obvious. Thus, it is not necessary to charge the storage battery with the maximum charging voltage.

As shown in Table 5, when the load current Io reaches 0.4C, the processing unit 101 calculates, by means of the control method 400, that the threshold interval in which the DOD falls is 50000~100000, and the processing unit 101 selects 4.375 volts as the charging voltage according to Table 1. When the charging procedure is finished, the RSOC of the storage battery is 99%. By means of the phenomenon of voltage rise, the RSOC of the storage battery will be increase to 100% by itself. Thus, the storage battery still can be fully charged.

Therefore, when the load current Io becomes higher, the phenomenon of voltage rise becomes more obvious, so the charging voltage to the battery can be lower. In this way, the present invention can not only prevent the battery from being overcharged, but also save electricity to achieve energy saving effects.

FIG. 5 is a block diagram for a power system 800 in accordance with another one embodiment of the present invention. Please refer to FIG. 2 and FIG. 5. The power system 800 includes an AC/DC conversion device 810, a system control unit 803 and a battery device 100. The system control unit 803 also includes a switching device 803a and a voltage regulation device 803b. The AC/DC conversion device 810 is coupled to the AC power 900, and the AC/DC conversion device 810 converts the AC power 900 to a DC power for the system control unit 830. By the switching device 830a, the system control unit 830 delivers the DC power output by the AC/DC conversion device 810 to the voltage regulation device 830b and the load 300.

Because the AC/DC conversion device 810 continues to provide DC power to the load 300, it is not necessary for the battery device 100 to provide power to the load 300. At this time, the system control unit 830 notifies the processing unit 101 in the battery device 100 to stop the storage battery unit 102 discharging, and the processing unit 101 stops the discharging record procedure. Simultaneously, if the processing unit 101 identifies that the RSOC of the storage battery unit 102 is smaller than (or equal to) 3%, the processing unit 101 controls the voltage regulation device 830b to output the DC power, and the voltage regulation device 830b performs the a constant voltage charge to the storage battery unit 102.

When the AC power 900 is interrupted or is too low, the AC/DC conversion device 810 cannot supply DC power to the load 300. At this time, the system control unit 830 notifies the processing unit 101 in the battery device 100 to control the storage battery unit 102 to supply power to the load 300, and the processing unit 101 starts a discharge recording procedure. At this time, the system control unit 830 controls the switching device 830a to cut off the line between the battery device 100 and the AC/DC conversion device 810, so as to prevent the output of the AC/DC conversion device 810 from receiving the power supplied by the battery unit 102. By this, it can avoid the AC/DC conversion device 810 from being damaged by the power supplied by the battery unit 102.

When the AC power 900 is recovered, the storage battery unit 102 stops providing power to the load 300. Alternatively, when the RSOC of the storage battery unit 102 is smaller than (or equal to) 3%, the processing unit 101 stops the storage battery unit 102 discharging. When the AC power 900 is recovered, the processing unit 101 controls the voltage regulation device 830b to adjust AC power 900 to output DC power, and the voltage regulation device 830b performs a constant voltage charge to the storage battery unit 102.

In some other embodiments, the voltage regulation device 830b can be positioned in the battery device 100, but the present invention is not limited thereto.

In conclusion, the present invention mainly makes use of the phenomenon of voltage rise to adjust the charge voltage for charging the storage battery. In this way, the battery can be effectively prevented from being overcharged, and the effect of saving power can be achieved.

While the invention has been described above in terms of a preferred embodiment, it is not intended to limit the scope of the invention, and it should be understood by those of ordinary skill in the art without departing from the spirit and scope of the invention. Instead, the scope of the invention should be determined by the scope of the appended claims.

The terminology used herein is for the purpose of describing particular embodiments only and is not intended to limit the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

What is claimed is:

1. A battery device, comprising:
a storage battery unit;
a current sensing unit, coupled to the storage battery unit and a load for detecting a load current;
a temperature sensing unit, configured to measure a battery temperature of the storage battery unit;
a storage unit, configured to store a cycle number of the storage battery unit, a plurality of threshold intervals, and a plurality of charging voltage values, wherein each of the plurality of threshold intervals respectively corresponds to each of the plurality of charging voltage values; and
a processing unit, coupled to the storage battery unit and the storage unit, and configured to receive the load current and the battery temperature, wherein the processor is configured to perform a discharging record procedure, comprising:
obtaining a depth of discharge (DOD) for the storage battery unit based on the load current, the battery temperature and the cycle number; and
whenever the processing unit obtains the load current, the battery temperature, and the DOD, the processing unit stores the load current, the battery temperature, and the DOD in the storage unit;
wherein the processing unit is also configured to perform a charging procedure, comprising:
retrieving a maximum value of the plurality of DOD from the storage unit;
identifying one of the plurality of the threshold intervals that the maximum value falls within to be a working threshold interval;
selecting the charging voltage value corresponding to the working threshold interval to be a main charging value; and
using a DC voltage with the main charging value to perform a constant voltage charging for the storage battery unit.

2. The battery device of claim 1, wherein the processing unit is coupled to a voltage regulation device and the processing unit controls the voltage regulation device to provide the DC voltage for performing the constant voltage charging for the storage battery unit.

3. The battery device of claim 2, wherein when the processing unit detects that a battery voltage of the storage battery unit approaches the main charging value within an error range, the processing unit stops the charging procedure and increases the cycle number in the storage unit.

4. The battery device of claim 3, wherein when the processing unit identifies that a relative state-of-charge of the storage battery unit is greater than 3%, the processing unit performs the discharging record procedure.

5. The battery device of claim 3, wherein when the processing unit identifies that a relative state-of-charge of the storage battery unit is smaller than (or equal to) 3%, the processing unit stops the discharging record procedure and performs the charging procedure.

6. A control method for a storage battery unit, comprising:
detecting a load current;
detecting a battery temperature of the storage battery unit;
storing a cycle number of the storage battery unit, a plurality of threshold intervals, and a plurality of charging voltage values, wherein each of the plurality of threshold intervals respectively corresponds to each of the plurality of charging voltage values;
performing a discharging record procedure, comprising:
receiving the load current for storage in a storage unit;
receiving the battery temperature for storage in a storage unit;
whenever the load current and the battery temperature are obtained, the load current and the battery temperature are stored in the storage unit to generate a plurality of load current and a plurality of battery temperatures;
performing a charging procedure, comprising:
retrieving a maximum value of the plurality of load current from the storage unit;
retrieving a maximum value of the plurality of battery temperature from the storage unit;
computing a depth of discharge (DOD) for the storage battery unit based on the maximum value of the plurality of load current, the maximum value of the plurality of battery temperature and the cycle number;
identifying one of the plurality of threshold intervals that the DOD falls within to be a working threshold interval;
selecting the charging voltage value corresponding to the working threshold interval to be a main charging value; and
using a DC voltage with the main charging value to perform a constant voltage charging for the storage battery unit.

7. The control method of claim 6, wherein the control method is performed by a battery device comprising the storage battery unit.

8. The control method of claim 6, wherein a battery voltage of the storage battery unit approaches the main charging value within an error range, the charging procedure is stopped and the cycle number in the storage unit is increased.

9. The control method of claim 8, wherein when a relative state-of-charge of the storage battery unit is smaller than 3%, the discharging record procedure is stopped and the charging procedure is performed.

10. The control method of claim 8, wherein when a relative state-of-charge of the storage battery unit is greater than 3%, the discharging record procedure is performed.

* * * * *